United States Patent [19]

Masselin

[11] 4,301,465
[45] Nov. 17, 1981

[54] COVER MOUNTED MULTI-COLUMNAR SEMICONDUCTOR ASSEMBLY

[75] Inventor: Michel Masselin, Velizy Villacoublay, France

[73] Assignee: Alsthom-Atlantique, Paris, France

[21] Appl. No.: 37,083

[22] Filed: May 8, 1979

[30] Foreign Application Priority Data

Mar. 12, 1979 [FR] France ................... 79 06235

[51] Int. Cl.³ ............. H01L 25/04; H01L 23/42; H01L 23/44
[52] U.S. Cl. ........................... 357/82; 357/79; 357/81; 357/68
[58] Field of Search ............. 357/79, 81, 82, 68

[56] References Cited

U.S. PATENT DOCUMENTS

| | | | |
|---|---|---|---|
| 3,333,163 | 7/1967 | Wislocky | 357/79 |
| 3,471,757 | 10/1969 | Sias | 357/79 |
| 3,502,956 | 3/1970 | Fries et al. | 357/76 |
| 3,573,574 | 4/1971 | Davis | 357/79 |
| 3,603,381 | 9/1971 | Scherbaum | 357/79 |
| 3,743,893 | 7/1973 | Yamomoto | 357/79 |
| 3,763,402 | 10/1973 | Shore | 357/79 |
| 3,808,471 | 4/1974 | Grandia | 357/79 |
| 3,885,243 | 5/1975 | Weisshaar et al. | 357/79 |
| 4,010,489 | 3/1977 | Bourbeau et al. | 357/82 |

Primary Examiner—Andrew J. James
Attorney, Agent, or Firm—Sughrue, Mion, Zinn, Macpeak and Seas

[57] ABSTRACT

A circuit allowing the bulk to be reduced and the maintenance of the device to be improved. It includes two end plates connected together by a welded shaft and a plurality of columns of semiconductors which can be clamped independently, one of the plates being used for clamping and the other plate being used as a cover for the casing which contains the circuit. Application to supplying electric motors for railways.

4 Claims, 3 Drawing Figures

COVER MOUNTED MULTI-COLUMNAR SEMICONDUCTOR ASSEMBLY

BACKGROUND OF THE INVENTION

The present invention relates to a mounting arrangement for power semiconductors, said arrangement including a cooling system which uses a cooling fluid.

It is known through French patent application No. 75 30 527 on Oct. 6, 1975, by the assignee, to constitute columns of diodes or of thyristors immersed in a fluorinated hydrocarbon and contained in a casing. These columns, disposed in a star configuration, are installed between two end plates disposed at either end of a central tie rod screwed at both its ends by two nuts which provide an overall pressure on the columns of diodes and of thyristors which is sufficient to provide close contact between the components in each column. The cover of the casing is made of insulating material and includes firstly threaded rods to support the set of columns by one of the end plates and secondly a plurality of terminals to feed the columns parallel to these terminals. The device has, however, some disadvantages. The clamping common to the three columns imposes the use of washers which exert a great load which represents the sum of the loads of each column. The circuit is tricky to form when the loads are not identical for each column. Further, when a semiconductor is replaced, the two columns not concerned by the replacement remain in an unstable balanced position without any mechanical stability throughout the whole operation. Lastly, the input and output power connections are installed outside the bulk of the columns of semiconductors. This causes a loss of space on the cover of the casing and therefore a limitation of the number of supply terminals.

SUMMARY OF THE INVENTION

The circuit in accordance with the present invention remedies these various drawbacks. Indeed, in the circuit with a casing which has the same bulk, the columns of semiconductors can be more numerous, maintenance of the semiconductors of each column can be effected more easily and the load of one column can be adjusted independently from the other columns.

The present invention provides a circuit of power semiconductors cooled by a cooling liquid, said circuit including columns of semiconductors spaced out, made of solid copper blocks which constitute the electrodes, the columns being installed between a first end plate and a second end plate, the assembly being disposed in a casing which contains the cooling fluid, said circuit being characterized in that said first end plate the cover of the casing and that said second end plate includes, for each of the columns independent clamping means.

According to one particularity of the invention, said first and second plates are both made of metal and are integral with each other via a metal shaft welded to each of the plates.

According to another particularity of the invention, said first metal plate includes first insulating through bushings, each disposed in the axes of said columns and second insulating through bushings disposed outside the axes of said columns.

According to another particularity of the invention said means for clamping a column which bears against said first insulating through bushing is constituted by a screw whose head co-operates with said first plate and which causes pressure to be applied to the calibrated washers which act on a washer guide disposed at the end of the column.

BRIEF DESCRIPTION OF THE DRAWINGS

An embodiment given purely by way of illustration and having no limiting character is described hereinbelow with reference to the accompanying schematic FIGS. 1 to 3. Components illustrated in several of these figures bear in all of these the same reference numerals therein.

DESCRIPTION OF THE PREFERRED EMBODIMENTS

Figure 1:
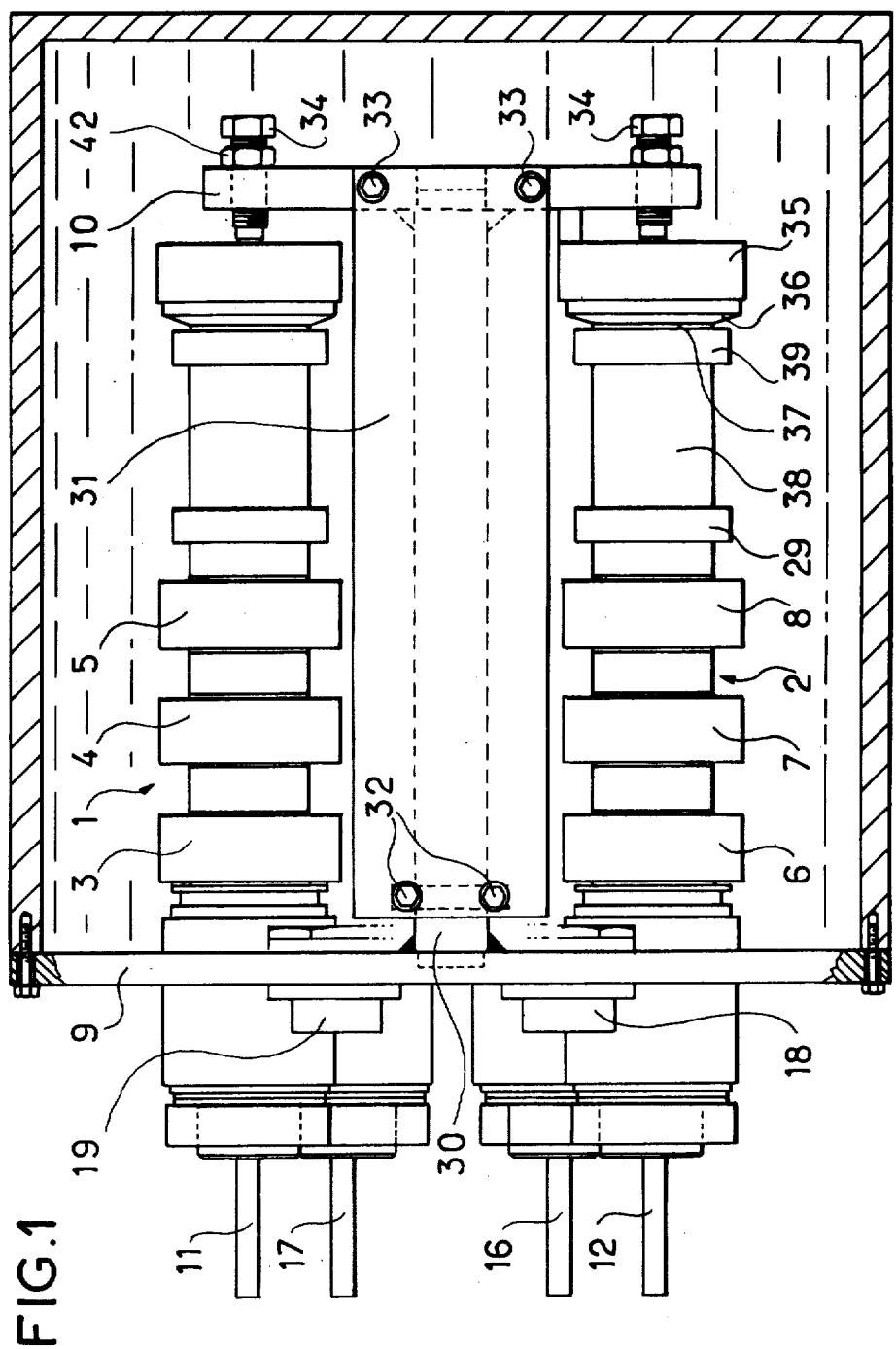
FIG. 1 is a schematic top plan view of the semiconductor circuit.
Figure 2:
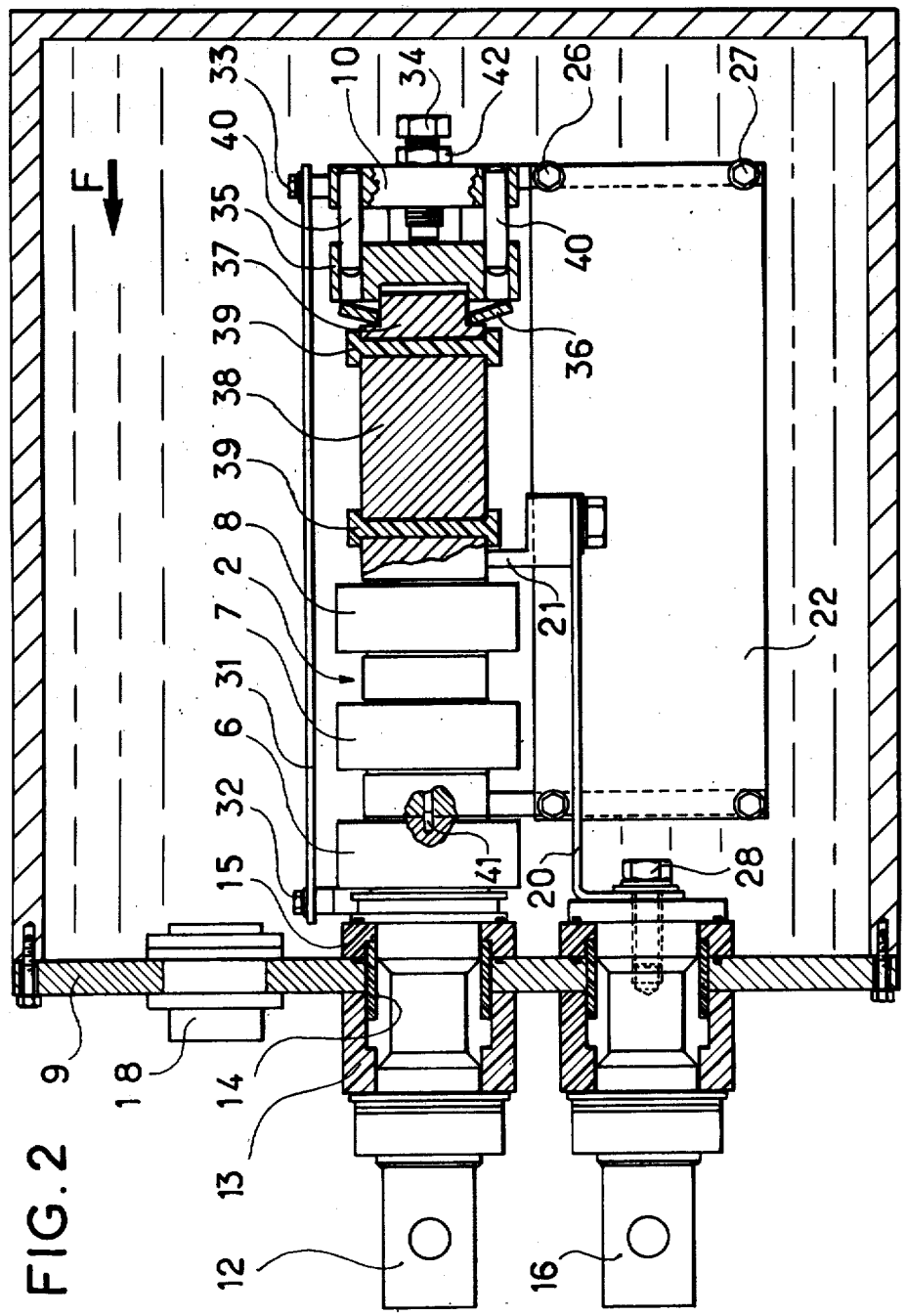
FIG. 2 is a schematic side elevation and partial cross-section of the same circuit.

As shown in the figures, two columns 1 and 2 form a circuit, respectively of diodes 3, 4 and 5 and of thyristors 6, 7 and 8, disposed in series, are installed between two metal end plates 9 and 10 made of stainless steel or the like. The octagonal plate 9, for example, acts as a cover for the casing, (not shown), which contains the circuit and the cooling liquid (not shown). The plate 9 includes output terminals 11 and 12 for the rectified voltage, disposed in the axis of the columns 1 and 2. The output terminals 11 and 12 are insulated from the plate 9 by three sleeves such as 13, 14 and 15 made of a plastics material. Power supply terminals 16 and 17 are also disposed on the cover 9 through which they pass via insulating passages formed by means of sleeves similar to the sleeves 13, 14 and 15. Supply terminals 18 and 19 for the triggers of the thyristors 6, 7 and 8 pass through the cover 9 and are electrically insulated therefrom. The terminals 16, 17, 18 and 19 are disposed on either side of the terminals 11 and 12, outside the axes of the columns 1 and 2.

Since the output terminals 11 and 12 are each disposed in the axes of the columns 1 and 2, the bulk on the cover 9 is reduced and there results the possibility of disposing a great number of output terminals and consequently of columns of semiconductors. The supply terminals such as 16 allow access via connections such as 20 and 21 to the electrodes of the components such as 6, 7 and 8. A plate which bears a printed circuit such as 22 or 23, connected by spacers 24 and 25 screwed by screws 26 and 27, allows protective electric functions to be performed.

Figure 3:
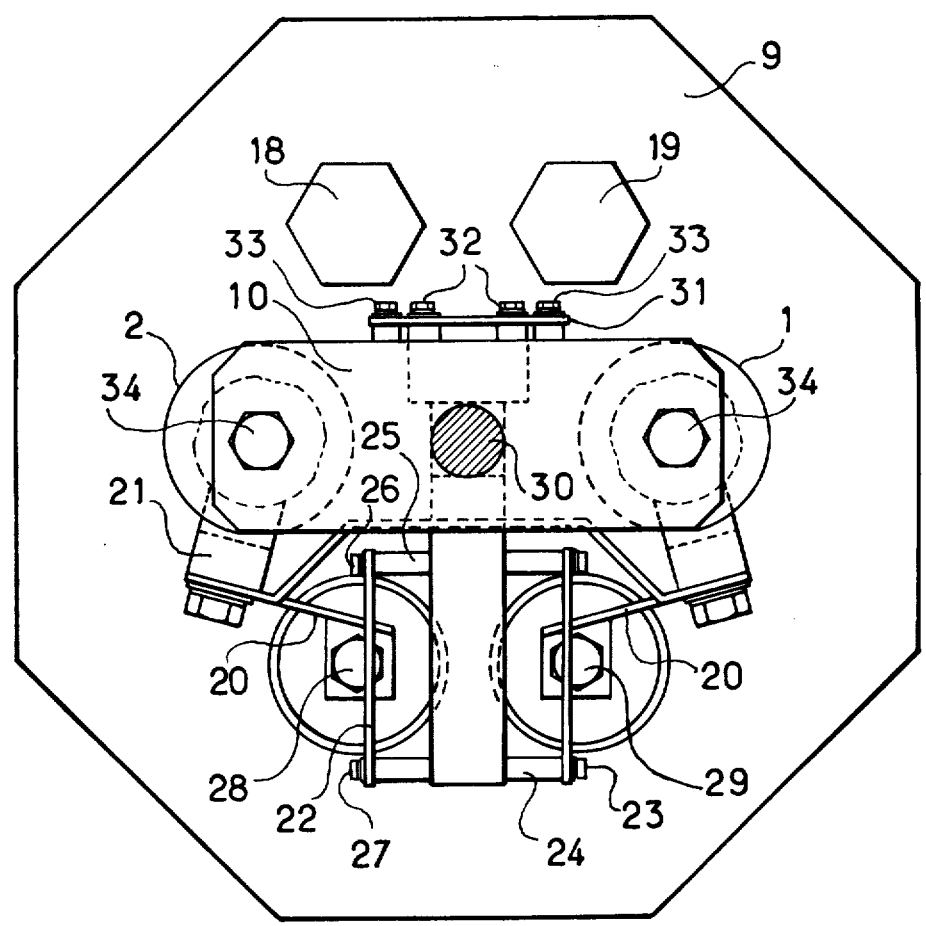
FIG. 3 is a schematic end view in the direction of arrow F, FIG. 2.

FIGS. 1 and 3 show the cover 9 and the end plate 10 integral with each other via a shaft 30 made of the same metal as the plates 9 and 10 and brazed thereto at both its ends. The shaft 30 is advantageously disposed at the centre of symmetry of the plates 9 and 10. A printed circuit board 31 is fixed between the two columns 1 and 2 firstly by screws 33 to the plate 10 and secondly by screws 32 and the spacers to the shaft 30. The printed circuit board 31 distributes, from the terminals 18 and 19, the control currents for the triggers of the thyristors 6, 7 and 8.

The clamping means of each of the columns 1 and 2 consist of a screw 34 and a lock nut 42 which pass through a threaded portion of the plate 10 and bear against a clamping part 35 which clamps a plurality of spring washers 36 whose quantity is determined as a function of the pressure required for each of the columns. The washers 36 are guided by a washer guide 37 which bears on a stud 38 and the components 6, 7 and 8 via insulating separators such as 39. The result of this is that the components which form a part of the columns 1 and 2 can be electrically insulated. So as to prevent the rotation of the components of columns 1 and 2, when tightening the screw 34, pins 40 are disposed between the plate 10 and the clamping part 35.

So as to improve the mechanical stability of the components of the columns 1 or 2, pins such as 41 are disposed between the adjacent components such as 6 and 7.

The circuit in accordance with the present invention enable columns of electronic components which are collectively cooled by a fluorinated hydrocarbon to be grouped together independently. Applications come within the field of electronic equipment for railways, in particular for controlling electric motors.

I claim:

1. A cover mounted multi-columnar semiconductor assembly for mounting to a casing containing a cooling fluid, said assembly comprising:
    a first end plate and a second end plate,
    a shaft fixed at its ends to the centers of respective plates,
    a plurality of columnar arrays of semiconductors spaced apart by solid copper blocks interposed between said semiconductors, with said arrays being installed between said plates,
    the improvement wherein said first end plate constitutes the cover of said casing such that said arrays are disposed within said cooling fluid, and wherein a plurality of spring biased clamping means are carried by said second end plate at circumferentially spaced positions corresponding to said columnar arrays and bear against the ends of said arrays to independently compress said arrays axially from said second end plate in the direction of said first end plate to adjust to the load of the individual columnar arrays, and
    wherein said clamping means comprises for each columnar array, an axially slidable clamping part mounted to said second end plate for sliding movement towards and away from said first end plate along the axis of said columnar arrays, a washer guide disposed at the end of said columnar array and a spring washer interposed between said washer guide and said clamping part, and a screw threaded to said second end plate and having a head contacting the side of said clamping part opposite said spring washer, such that by rotation of said screw, the biasing force acting on said columnar array may be independently varied for a given columnar array.

2. The cover mounted multi-columnar semiconductor assembly according to claim 1, wherein said first and second end plates and said shaft are made of metal and are integrally joined to each other via said metal shaft which is welded at its ends to respective plates.

3. The cover mounted multi-columnar semiconductor assembly according to claim 2, wherein said first metal end plate includes first insulating through bushings each disposed in the axes of said columnar arrays and second insulating through bushings disposed outside the axis of said columnar arrays.

4. The cover mounted multi-columnar semiconductor assembly according to claim 1, wherein said copper block which constitutes an electrode is separated from said washer guide by at least one insulating separator.

* * * * *